(12) United States Patent
Tanaka

(10) Patent No.: US 10,964,633 B2
(45) Date of Patent: Mar. 30, 2021

(54) WIRING SUBSTRATE

(71) Applicant: SHINKO ELECTRIC INDUSTRIES CO., LTD., Nagano (JP)

(72) Inventor: Hikaru Tanaka, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 16/852,913

(22) Filed: Apr. 20, 2020

(65) Prior Publication Data

US 2020/0343169 A1  Oct. 29, 2020

(30) Foreign Application Priority Data

Apr. 26, 2019  (JP) .............................. JP2019-085970

(51) Int. Cl.
*H05K 1/11* (2006.01)
*H01L 23/498* (2006.01)
*H01L 21/48* (2006.01)
*H01L 23/00* (2006.01)

(52) U.S. Cl.
CPC .... *H01L 23/49816* (2013.01); *H01L 21/4853* (2013.01); *H01L 21/4857* (2013.01); *H01L 23/49822* (2013.01); *H01L 23/49838* (2013.01); *H01L 24/81* (2013.01); *H05K 1/112* (2013.01); *H01L 24/16* (2013.01); *H01L 24/32* (2013.01); *H01L 24/73* (2013.01); *H01L 2224/16227* (2013.01); *H01L 2224/16238* (2013.01); *H01L 2224/32225* (2013.01); *H01L 2224/73204* (2013.01); *H01L 2224/81192* (2013.01)

(58) Field of Classification Search
CPC ........ H05K 1/112; H05K 1/113; H05K 1/114; H05K 1/115; H05K 1/116
See application file for complete search history.

(56) References Cited

U.S. PATENT DOCUMENTS

2007/0186412 A1*  8/2007  Hsu .................. H05K 1/112
                                                29/830
2013/0118794 A1*  5/2013  Tseng ................. H01L 21/4857
                                                174/266
2017/0250153 A1   8/2017  Kikuchi et al.

FOREIGN PATENT DOCUMENTS

JP        2017-103878      6/2017
JP        2017-152646      8/2017

* cited by examiner

*Primary Examiner* — Jeremy C Norris
(74) *Attorney, Agent, or Firm* — Rankin, Hill & Clark LLP

(57) ABSTRACT

A wiring substrate includes: a wiring layer; an insulating layer covering the wiring layer, and including a first opening portion exposing the wiring layer and a second opening portion exposing the wiring layer, wherein a diameter of the second opening portion is larger than that of the first opening portion; a first metal layer formed in the first opening portion and the second opening portion, and having a recess in the second opening portion; and a second metal layer that is formed on the first metal layer formed in the first opening portion and the second opening portion, wherein a portion of the second metal layer fills the recess. The first metal layer and the second metal layer serve as connection terminals to be electrically connected to an electronic component.

24 Claims, 13 Drawing Sheets

WIRING SUBSTRATE

This application claims priority from Japanese Patent Applications No. 2019-085970, filed on Apr. 26, 2019, the entire contents of which are herein incorporated by reference.

BACKGROUND

Technical Field

The present disclosure relates to a wiring substrate.

Background Art

Generally, bumps serving as connection terminals to a semiconductor chip may be formed on a wiring substrate on which the semiconductor chip will be mounted. The bumps are metal protrusions connected to a conductor layer of the wiring substrate. The bumps protrude outward from opening portions provided in a solder resist layer covering the conductor layer. Each of such bumps may, for example, use a two-layer structure in which two layers are formed by plating with two different kinds of metal.

Specifically, first metal layers which are, for example, made of copper are formed by plating in and around the opening portions provided in the solder resist layer, and second metal layers which are, for example, made of tin, solder, or the like, are formed by plating as upper layers on the first metal layers. When only the second metal layers are melted and solidified by a reflow process, bumps each having a spherical shape are formed. That is, since a melting point of the second metal layers is lower than that of the first metal layers, proper reflow temperature can be set not to melt the first metal layers but to melt only the second metal layers so as to form the bumps (see e.g., JP-A-2007-103878 and JP-A-2017-152646).

The wiring substrate and the semiconductor chip may be connected to each other through the bumps. That is, for example, connection terminals for inputting/outputting an electric signal, and connection terminals for applying a power supply voltage may be provided separately. In such a case, all the diameters of the bumps as the connection terminals do not have to be always the same but the bumps may be provided to have different diameters. Specifically, for example, the bumps are mixed to have a small diameter and a large diameter so that the diameter of the bumps for inputting/outputting the electric signal is comparatively small while the diameter of the bumps for applying the power supply voltage is comparatively large.

When the bumps are formed to have the aforementioned two-layer structures by plating, the large-diameter bumps become higher than the small-diameter bumps. That is, in the plating step of the first metal layers and the second metal layers, the first metal layers and the second metal layers are plated with the same thickness in the small-diameter bumps and the large-diameter bumps. Accordingly, the volume of the second metal layer in each of the large-diameter bumps is larger than the volume of the second metal layer in each of the small-diameter bumps. When the second metal layers are melted and solidified, the surfaces of the second metal layers are formed into spherical shapes. In this state, the large-diameter bumps protrude to be higher than the small-diameter bumps.

When the bumps having the different heights are mixed, there is a problem of deteriorating connection reliability between the wiring substrate and the semiconductor chip. Specifically, top portions of the small-diameter bumps low in height and electrodes of the semiconductor chip may not contact each other sufficiently. Thus, open failure may occur. In addition, when the semiconductor chip is mounted, top portions of the large-diameter bumps high in height may be pressed to extend in a lateral direction so as to come into contact with adjacent bumps. Thus, short circuit failure may occur.

Such deterioration of the connection reliability does not occur only when the semiconductor chip is mounted on the wiring substrate but may also occur when another electronic component is mounted on the wiring substrate through a plurality of bumps.

SUMMARY

The present disclosure provides a wiring substrate in which connection reliability to an electronic component can be improved.

A certain embodiment provides a wiring substrate.

The wiring substrate comprises:

a wiring layer;

an insulating layer covering the wiring layer, and comprising a first opening portion exposing the wiring layer and a second opening portion exposing the wiring layer, wherein a diameter of the second opening portion is larger than that of the first opening portion;

a first metal layer formed in the first opening portion and the second opening portion, and having a recess in the second opening portion; and a second metal layer that is formed on the first metal layer formed in the first opening portion and the second opening portion, wherein a portion of the second metal layer fills the recess, wherein the first metal layer and the second metal layer serve as connection terminals to be electrically connected to an electronic component.

DESCRIPTION OF EMBODIMENT

An embodiment of a wiring substrate and a method for manufacturing the wiring substrate disclosed by the present application will be described below in detail with reference to the drawings. Incidentally, the present invention is not limited by the embodiment.

Figure 1:
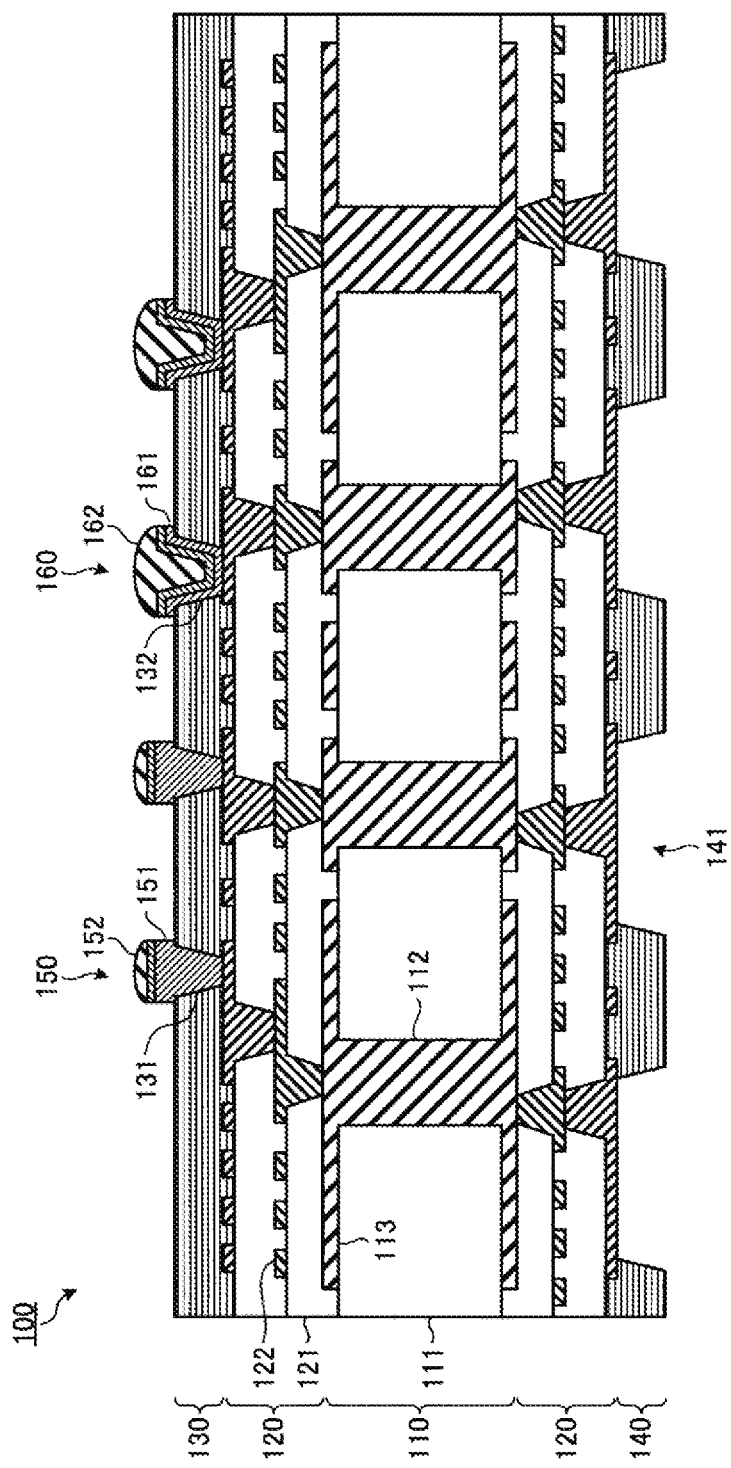
FIG. 1 is a view showing the configuration of a wiring substrate according to an embodiment.

FIG. 1 is a view showing the configuration of the wiring substrate 100 according to the embodiment. In FIG. 1, a section of the wiring substrate 100 is schematically shown. The wiring substrate 100 shown in FIG. 1 can be, for example, used as a substrate of a semiconductor package, on which a semiconductor chip will be mounted.

The wiring substrate 100 is formed into a layered structure which has a core substrate 110, multilayer wiring structures 120, and solder resist layers 130 and 140. In the following description, the solder resist layer 140 is illustrated as a lowermost layer, and the solder resist layer 130 is illustrated as an uppermost layer, as shown in FIG. 1. For example, the wiring substrate 100 may be used in a vertically inverted manner or may be used at any posture.

In the core substrate 110, wiring layers 113 are formed respectively on opposite faces of a base material 111 by plating. The base material 111 is a plate-like insulator. The wiring layers 113 on the opposite faces are connected to each other by vias 112 if necessary.

In each of the multilayer wiring structures 120, layers each of which includes an insulating layer 121 having electric non-conductance and a wiring layer 122 having electric conductance are deposited on each other. In FIG. 1, two layers are deposited on each other inside the multilayer wiring structure 120 above the core substrate 110, and two layers are deposited on each other inside the multilayer wiring structure 120 under the core substrate 110. However, the number of the deposited layers may be one or three or more.

The solder resist layer 130 is a layer which covers the wiring layer 122 in the surface of the multilayer wiring structure 120 to protect wiring. The solder resist layer 130 is a layer which is, for example, made of an insulating photosensitive resin such as an acrylic resin or a polyimide resin. In other words, the solder resist layer 130 is an insulating layer. Incidentally, the solder resist layer 130 may be, for example, formed by use of an insulating non-photosensitive resin such as an epoxy resin.

The solder resist layer 130 side of the wiring substrate 100 is a face on which, for example, an electronic component such as a semiconductor chip will be mounted. The solder resist layer 130 is pierced to provide opening portions 131 and 132 at positions where the semiconductor chip will be mounted. That is, the opening portions 131 and 132 are provided in the solder resist layer 130 in order to connect electrodes of the semiconductor chip to the wiring layer 122 of the multilayer wiring structure 120. The diameters of the opening portions 131 and 132 are different from each other, and the diameter of each of the opening portions 132 is larger than the diameter of each of the opening portions 131. When the solder resist layer 130 is formed by use of the photosensitive resin, the opening portions 131 and 132 can be formed by exposure to light and development. In addition, when the solder resist layer 130 is formed by use of the non-photosensitive resin, the opening portions 131 and 132 can be formed by laser machining.

Bumps 150 and 160 which are connection terminals electrically connecting the wiring layer 122 of the multilayer wiring structure 120 to the electrodes of the semiconductor chip are formed in the opening portions 131 and 132. Since the diameters of the opening portions 131 and 132 are different from each other, the diameters of the bumps 150 and 160 are also different from each other. That is, the small-diameter bumps 150 are formed in the small-diameter opening portions 131, and the large-diameter bumps 160 are formed in the large-diameter opening portions 132.

Each of the bumps 150 and 160 has a two-layer structure in which two layers are made of two different kinds of metal. Specifically, each of the bumps 150 has a first metal layer 151 which is, for example, made of copper, and a second metal layer 152 which is, for example, made of tin. For example, a nickel layer is interposed between bonding faces of the first metal layer 151 and the second metal layer 152. In the small-diameter bump 150, an upper face of the first metal layer 151 is flat, and the second metal layer 152 protrudes upward like a spherical shape from the flat upper face. On the other hand, each of the bumps 160 also has a first metal layer 161 which is, for example, made of copper, and a second metal layer 162 which is, for example, made of tin. For example, a nickel layer is interposed between bonding faces of the first metal layer 161 and the second metal layer 162. In the large-diameter bump 160, a recess is formed in the center of an upper face of the first metal layer 161 so that the center of the upper face of the first metal layer 161 is lower than its vicinity, and the second metal layer 162 protrudes upward like a spherical shape from the upper face.

Since the bump 160 is larger in diameter than the bump 150, the second metal layer 162 is larger in volume than the second metal layer 152. A portion of the second metal layer 162 is filled into the recess formed in the first metal layer 161. With this configuration, height of a top portion of the second metal layer 162 from the surface of the solder resist layer 130 becomes lower. Further, height of the vicinity of the recess of the upper face of the first metal layer 161 is lower than height of the upper face of the first metal layer 151. In order words, a lower face of the second metal layer 162 is located at a lower position than a lower face of the second metal layer 152. With this configuration, height of a top portion of the bump 150 and the height of a top portion of the bump 160 can be equivalent to each other even when the second metal layer 162 larger in volume than the second metal layer 152 protrudes largely and upward. When, for example, the semiconductor chip is mounted above the bumps 150 and 160, the top portions of the bumps 150 and 160 surely come into contact with the electrodes of the semiconductor chip so that connection reliability therebetween can be improved.

In a manner similar to or the same as the solder resist layer 130, the solder resist layer 140 is a layer which covers the wiring layer 122 in the surface of the multilayer wiring structure 120 to protect wiring. The solder resist layer 140 is a layer which is, for example, made of an insulating photosensitive resin such as an acrylic resin or a polyimide resin. In other words, the solder resist layer 140 is an insulating layer. Incidentally, the solder resist layer 140 may be, for example, formed by use of an insulating non-photosensitive resin such as an epoxy resin.

The solder resist layer 140 side of the wiring substrate 100 is a face to be connected to an external component, a device, or the like. The solder resist layer 140 is pierced to provide opening portions 141 at positions where external connection terminals to be electrically connected to the external component, the device, or the like, will be formed, and the wiring layer 122 of the multilayer wiring structure 120 is exposed from the opening portions 141. For example, an external connection terminal such as a solder ball is formed in each of the opening portions 141. When the solder resist layer 140 is formed by use of the photosensitive resin, the opening portions 141 can be formed by exposure to light and development. In addition, when the solder resist layer 140 is formed by use of the non-photosensitive resin, the opening portions 141 can be formed by laser machining.

Figure 2:
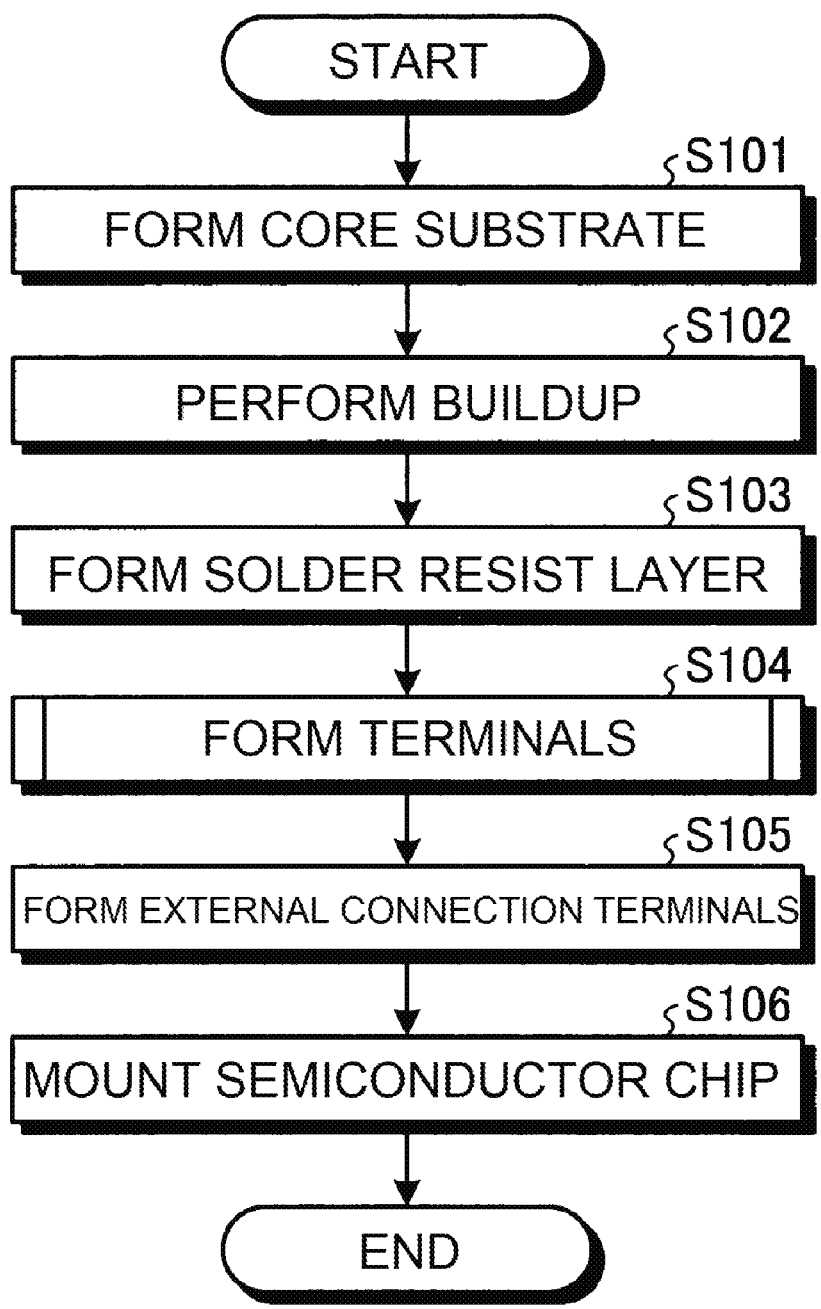
FIG. 2 is a flow chart showing a method for manufacturing a semiconductor package according to an embodiment.

Next, a specific example about a method for manufacturing a semiconductor package having the wiring substrate 100 configured in the aforementioned manner will be described with reference to a flow chart of FIG. 2.

Figure 3:
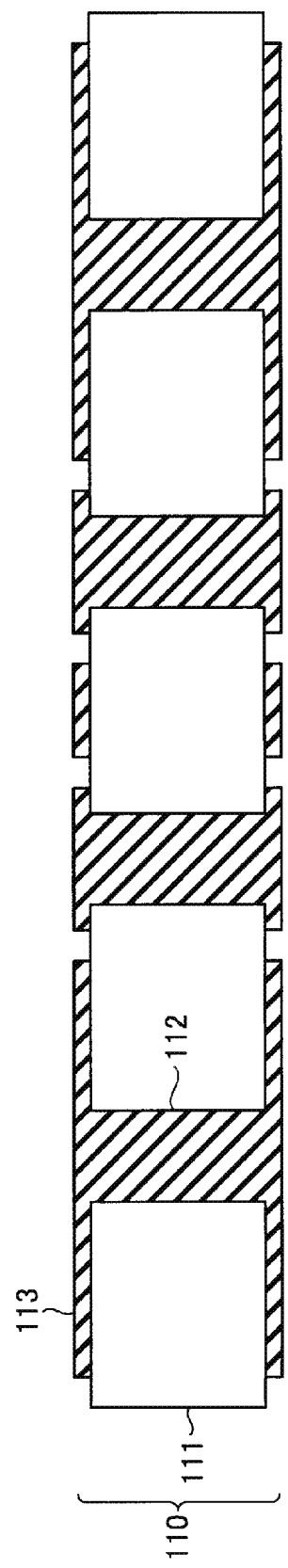
FIG. 3 is a view showing a specific example of formation of a core substrate.

First, a core substrate 110 to be a supporting member of the wiring substrate 100 is formed (step S101). Specifically, for example, as shown in FIG. 3, vias 112 are formed in a base material 111 to penetrate the base material 111. The base material 111 is a plate-like insulator. At the same time, wiring layers 113 which are, for example, made of metal such as copper are formed respectively on opposite faces of the base material 111, for example, by copper foil or by copper plating. If necessary, the wiring layers 113 on the opposite faces of the base material 111 are connected to each other through the vias 112 which are, for example, formed by metal plating such as copper plating. For example, a base material formed by impregnating a reinforcing material such as glass woven fabric with an insulating resin such as an epoxy resin can be used as the base material 111. In addition to the glass woven fabric, glass non-woven fabric, aramid woven fabric, aramid non-woven fabric, or the like, can be used as the reinforcing material. Moreover, in addition to the epoxy resin, a polyimide resin, a cyanate resin, or the like, can be used as the insulating resin.

Figure 4:
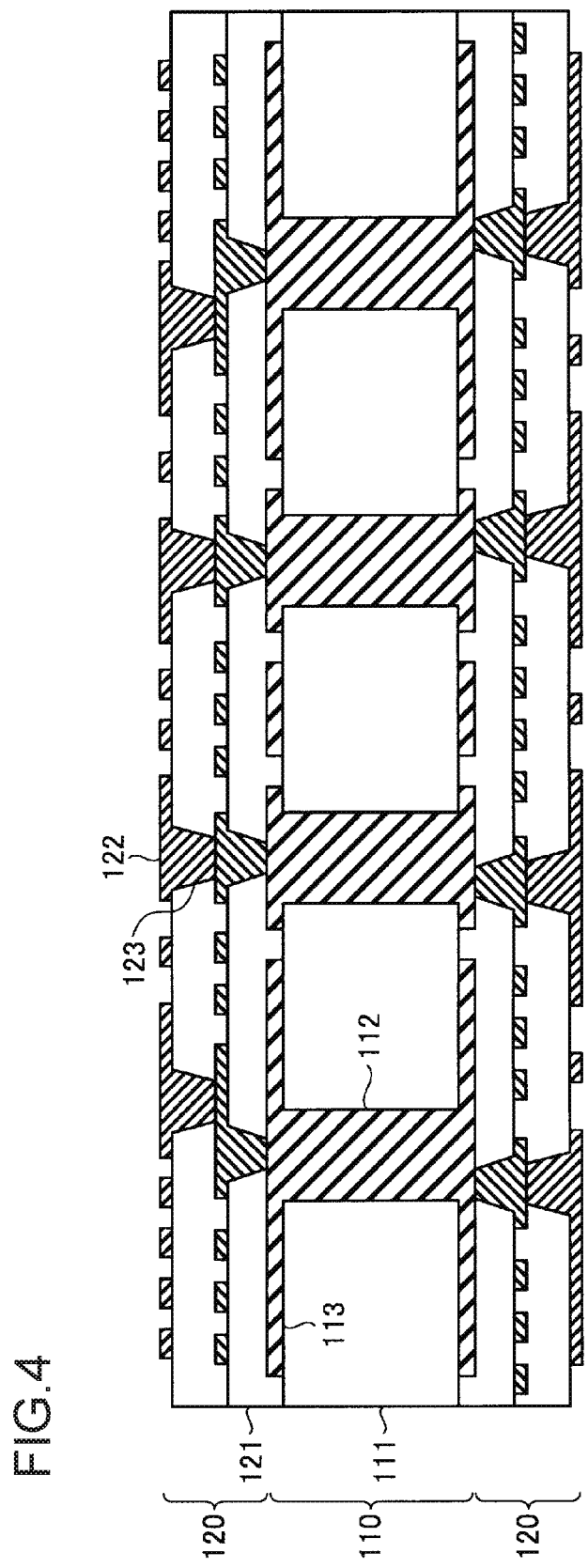
FIG. 4 is a view showing a specific example of buildup.

Multilayer wiring structures 120 are formed respectively on an upper face and a lower face of the core substrate 110 by a buildup method (step S102). Specifically, for example, as shown in FIG. 4, insulating layers 121 are formed respectively on the upper face and the lower face of the core substrate 110, and wiring layers 122 are formed on the surfaces of the insulating layers 121. Each of the insulating layers 121 is formed, for example, by use of an insulating resin such as an epoxy resin or a polyimide resin. In addition, each of the wiring layers 122 is formed, for example, by use of metal plating such as copper plating.

If occasions demand, the wiring layer 113 of the core substrate 110 and the wiring layer 122, or the wiring layer 122 and a wiring layer 122 which is an adjacent layer thereto are connected to each other through vias 123 which are formed, for example, by metal plating such as copper plating. A plurality of insulating layers 121 and a plurality of wiring layers 122 may be formed on each of the upper face and the lower face of the core substrate 110.

When the multilayer wiring structures 120 are formed, the wiring layers 122 in the surfaces of the multilayer wiring structures 120 are covered with solder resist layers 130 and 140 (step S103). For example, the wiring layer 122 in the surface of the multilayer wiring structure 120 deposited on the upper face of the core substrate 110 is covered with the solder resist layer 130, and the wiring layer 122 in the surface of the multilayer wiring structure 120 deposited on the lower face of the core substrate 110 is covered with the solder resist layer 140.

Figure 5:
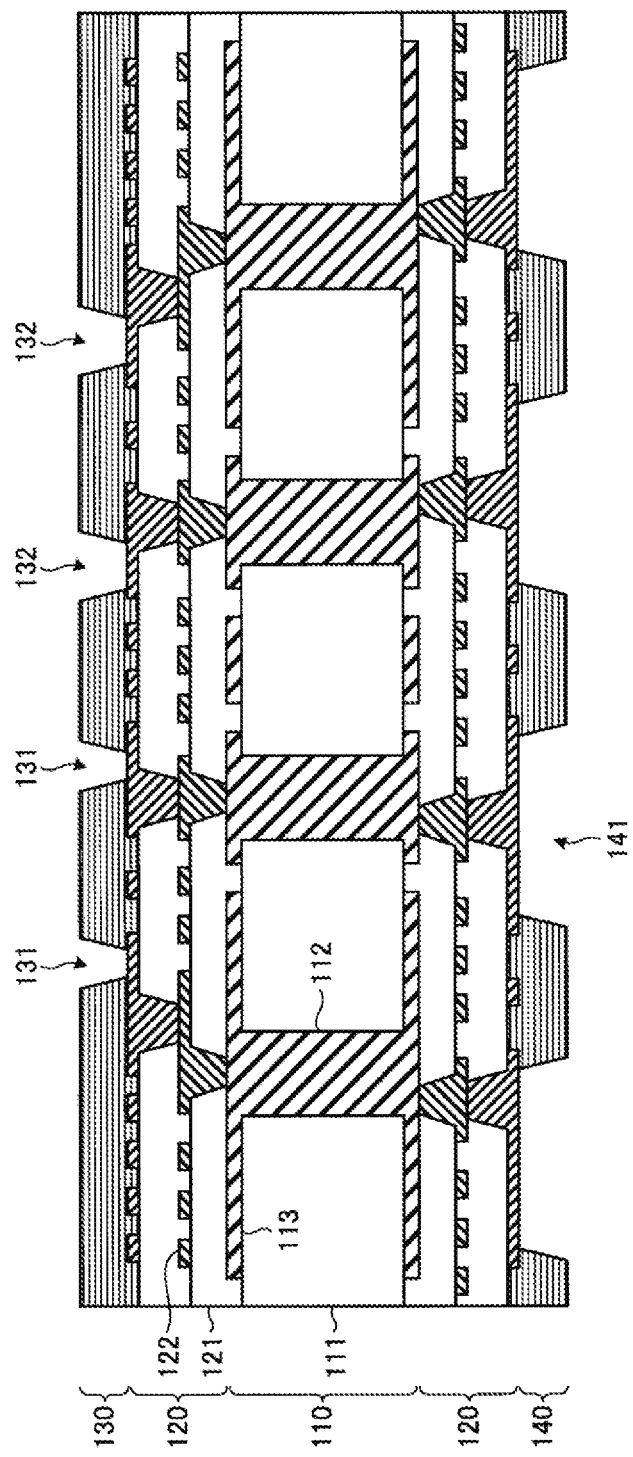
FIG. 5 is a view showing a specific example of formation of solder resist layers.

For example, as shown in FIG. 5, the solder resist layer 130 on a side where a semiconductor chip will be mounted is pierced to provide opening portions 131 and 132 at positions where connection terminals to the semiconductor chip will be provided. On this occasion, for example, the size of each of the connection terminals differs according to each of kinds of electrodes of the semiconductor chip. Accordingly, the diameter of each of the opening portions 131 and the diameter of each of the opening portions 132 differ from each other. That is, for example, the opening portion 131 where the connection terminal for inputting/outputting an electric signal will be formed is relatively small whereas the diameter of the opening portion 132 where the connection terminal for applying a power supply voltage will be formed is relatively large. The wiring layer 122 in the surface of the multilayer wiring structure 120 is exposed in the bottoms of the opening portions 131 and 132.

On the other hand, the solder resist layer 140 on a side to be connected to an external component or a device is pierced to provide opening portions 141 at positions where external connection terminals will be provided. The wiring layer 122 in the surface of the multilayer wiring structure 120 is exposed in the bottoms of the opening portions 141. When a photosensitive resin is used as the material of the solder resist layers 130 and 140, the opening portions 131, 132 and 141 can be formed by exposure to light and development. In addition, when a non-photosensitive resin is used as the material of the solder resist layers 130 and 140, the opening portions 131, 132 and 141 can be formed by laser machining.

Figure 6:
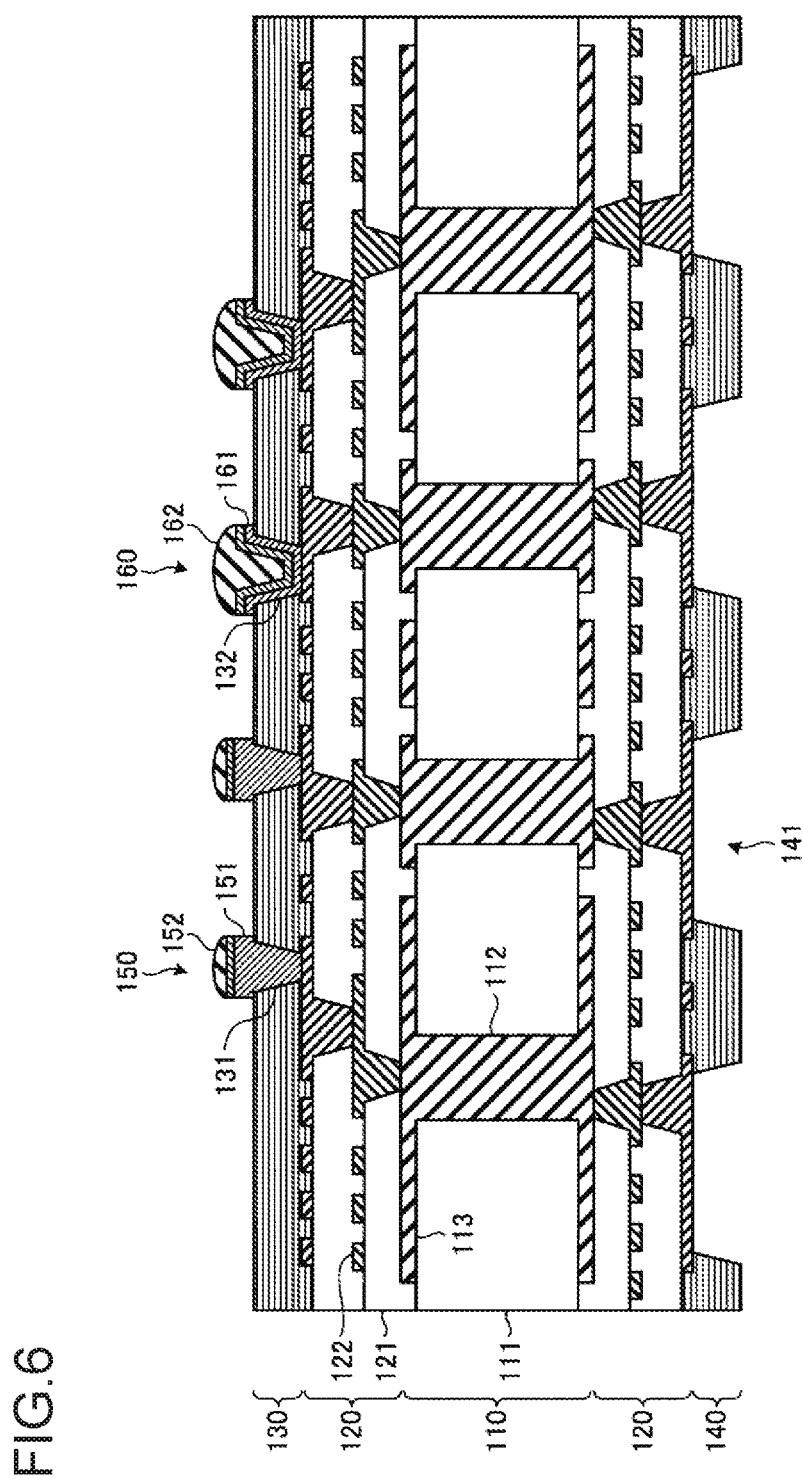
FIG. 6 is a view showing a specific example of formation of terminals.

The connection terminals for making connection with the semiconductor chip are formed in the opening portions 131 and 132 of the solder resist layer 130 (step S104). That is, as shown in FIG. 6, small-diameter bumps 150 are formed in the opening portions 131, and large-diameter bumps 160 are formed in the opening portions 132. Each of the bumps 150 and 160 has a two-layer structure in which a second metal layer 152, 162 overlapping with a first metal layer 151, 161 protrudes upward like a spherical shape. Both the first metal layer 151, 161 and the second metal layer 152, 162 are formed by plating.

The first metal layer 151 is formed, for example, by plating the opening portions 131 and their vicinities with copper. The first metal layer 151 is filled in the opening portions 131, and has a flat upper face formed above the opening portions 131. That is, the upper face of the first metal layer 151 is a flat face positioned more distantly from the wiring layer 122 than an upper face of the solder resist layer 130. The flat upper face of the first metal layer 151 is, for example, plated with tin with interposition of a nickel layer so that the second metal layer 152 is formed. The second metal layer 152 goes through a reflow process so as to be melted and solidified to protrude upward like a spherical shape.

On the other hand, each of the opening portions 132 and its vicinity are, for example, plated with copper so that the first metal layer 161 is formed. In the first metal layer 161, an upper face having a recess at the center is formed. The upper face of the first metal layer 161 is formed more distantly from the wiring layer 122 than the upper face of the solder resist layer 130 in the vicinity of the recess. The opening portions 131 and 132 are plated with copper simultaneously. By adjustment of composition of a copper sulfate plating solution used for the plating and electrolytic copper plating conditions, the first metal layers 151 and 161 having different shapes can be formed in the small-diameter opening portions 131 and the large-diameter opening portions 132. That is, the upper face of the first metal layer 151 is flat whereas the upper face of the first metal layer 161 has the recess. Of the first metal layer 161, the upper face having the recess is, for example, plated with tin with interposition of a nickel layer so that the second metal layer 162 is formed.

The second metal layer 162 goes through a reflow process so as to be melted and solidified to protrude upward like a spherical shape.

A portion of the second metal layer 162 is filled in the recess of the first metal layer 161. Accordingly, height of a top portion of the second metal layer 162 is lower than that in a case where the second metal layer 162 is formed on a flat face upper than the opening portion 132. Further, height of the vicinity of the recess of the first metal layer 161 is lower than height of the upper face of the first metal layer 151. Therefore, the height of the top portion of the second metal layer 162 is lower than that in a case where the second metal layer 162 is formed on a face at high as the upper face of the first metal layer 151. From the above description, heights between the surface of the solder resist layer 130 and the top portions of the bumps 150 and 160 are equal to each other even when the volume of the second metal layer 162 of the large-diameter bump 160 is larger than the second metal layer 152 of the small-diameter bump 150. Incidentally, a step of forming the bumps 150 and 160 will be described later in detail.

Figure 7:
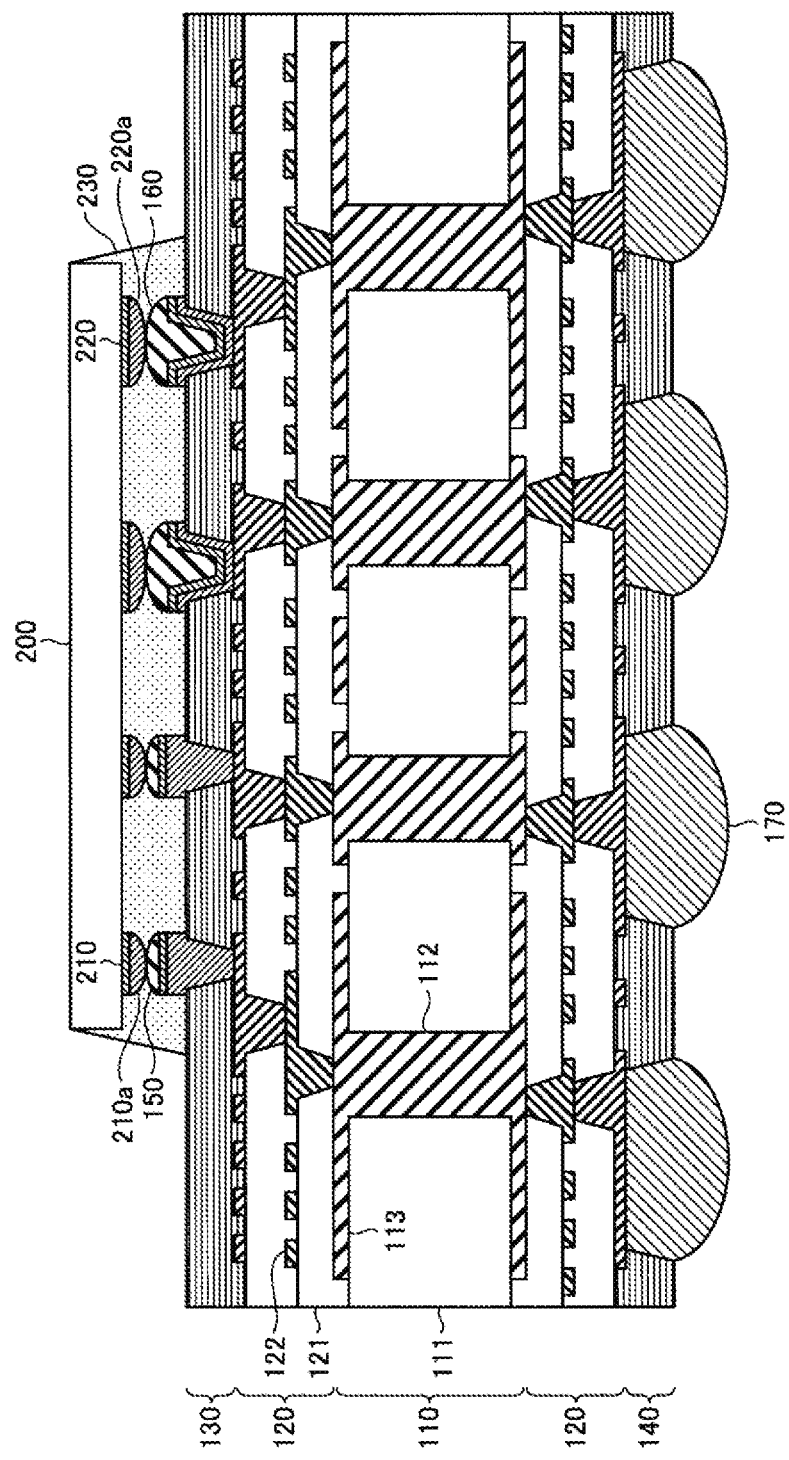
FIG. 7 is a view showing a specific example of mounting of a semiconductor chip.

When the bumps 150 and 160 are formed on the solder resist layer 130 side, external connection terminals are formed on the solder resist layer 140 side (step S105). The semiconductor chip is mounted on the solder resist layer 130 side (step S106). The bumps 150 and 160 and the electrodes of the semiconductor chip are connected to each other. Specifically, for example, as shown in FIG. 7, external connection terminals such as solder balls 170 are formed in the opening portions 141 of the solder resist layer 140. In addition, a semiconductor chip 200 is mounted above the bumps 150 and 160. In the semiconductor chip 200, electrodes 210 are bonded to the bumps 150, and electrodes 220 are bonded to the bumps 160. On this occasion, bumps 210$a$ and 220$a$ provided on the electrodes 210 and 220 of the semiconductor chip 200 and the bumps 150 and 160 are melted and solidified by reflowing. Therefore, in bonding portions between the electrodes 210 and 220 and the bumps 150 and 160, the bumps 210$a$ and 220$a$ and the bumps 150 and 160 are mixed with each other, melted and solidified.

The bonding portions between the electrodes 210 and 220 and the bumps 150 and 160 are sealed with an underfill resin 230. As a result, a semiconductor package in which the semiconductor chip 200 is mounted on the wiring substrate 100 is formed. Incidentally, the sequence of the aforementioned step of forming the external connection terminals and the aforementioned step of mounting the semiconductor chip may be reversed. That is, the external connection terminals such as the solder balls 170 may be formed in the opening portions 141 of the solder resist layer 140 after the semiconductor chip 200 is mounted on the wiring substrate 100.

Figure 8:
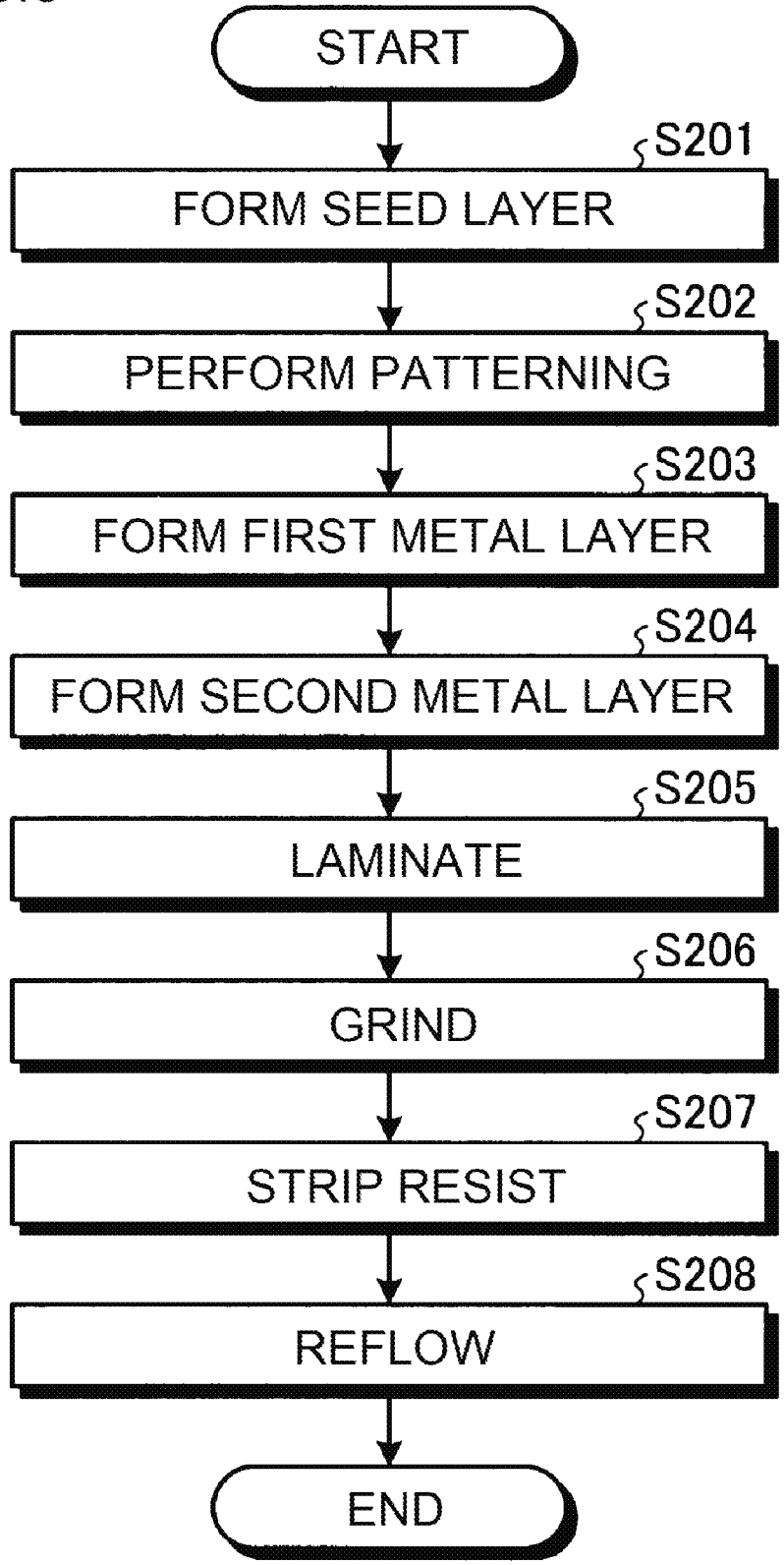
FIG. 8 is a flow chart showing a terminal forming step.

Next, a step of forming the bumps 150 and 160 functioning as connection terminals electrically connected to the semiconductor chip 200 will be described more specifically with reference to a flow chart shown in FIG. 8.

Figure 9:
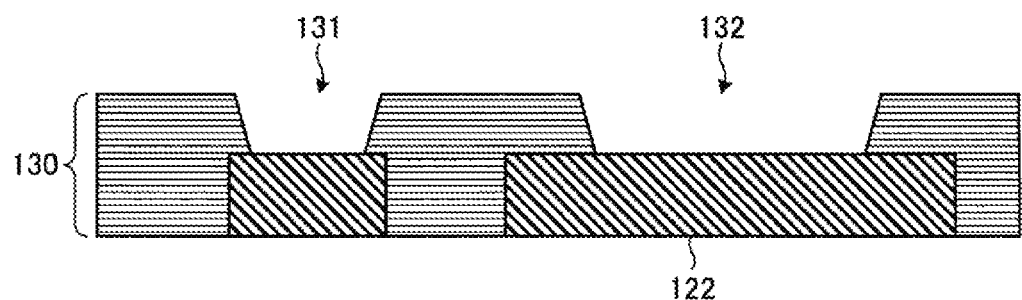
FIG. 9 is a view showing opening portions of a solder resist layer.

When the multilayer wiring structure 120 is deposited on the upper face of the core substrate 110, the wiring layer 122 of the multilayer wiring structure 120 is covered with the solder resist layer 130. For example, as shown in FIG. 9, the solder resist layer 130 is pierced to provide opening portions 131 and 132. The diameter of each of the opening portions 132 is larger than the diameter of each of the opening portions 131. The wiring layer 122 is exposed in the bottoms of the opening portions 131 and 132. An opening diameter of the opening portion 131 is, for example, about 20 to 30 µm, and depth of the opening portion 131 is about 13 to 23 µm. In addition, an opening diameter of the opening 132 is, for example, about 30 to 40 µm, and depth of the opening portion 132 is about 13 to 23 µm to be the same as the opening portion 131.

Figure 10:
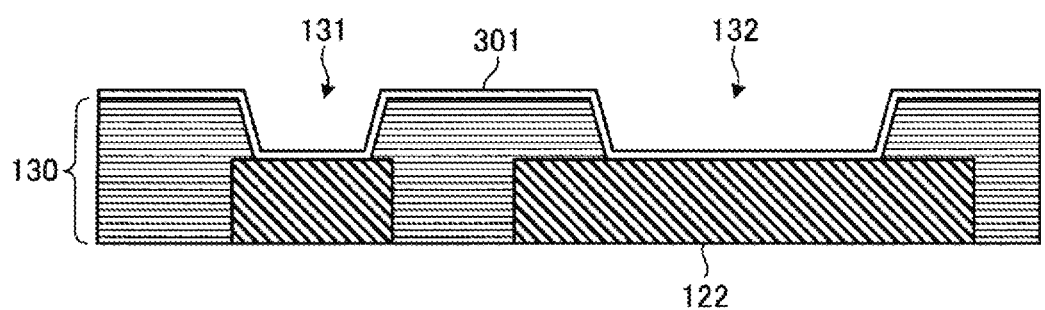
FIG. 10 is a view illustrating formation of a seed layer.

In this state, a seed layer is formed on the surface of the solder resist layer 130 (step S201). That is, for example, as shown in FIG. 10, the seed layer 301 is formed all over the surface of the solder resist layer 130 and the wiring layer 122 exposed in the opening portions 131 and 132, for example, by electroless copper plating, copper sputtering, or the like. Thickness of the seed layer 301 is, for example, about 0.40 to 0.60 µm. The seed layer 301 can be formed, for example, by electroless copper plating performed at a bath temperature of 34±2° C. for 15 minutes.

Figure 11:
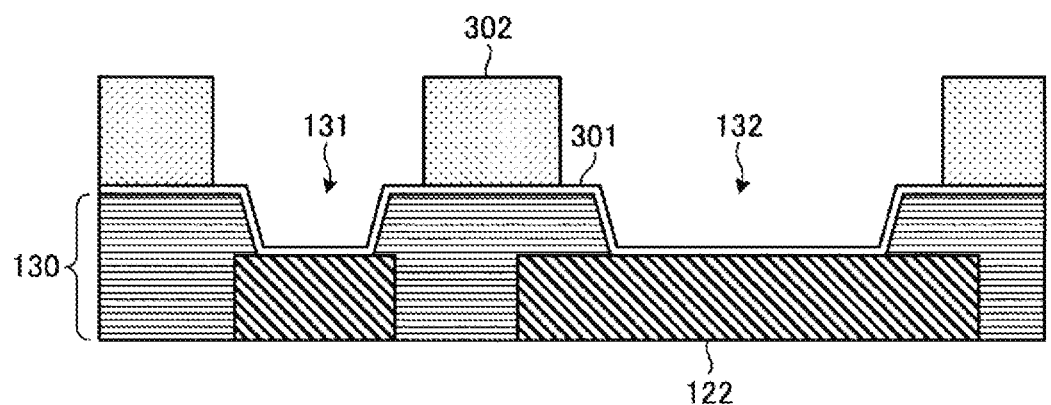
FIG. 11 is a view illustrating patterning.

Patterning for forming a circuit pattern is performed on the surface of the wiring substrate 100 (step S202). Specifically, for example, as shown in FIG. 11, the circuit pattern is exposed to light and developed after a dry film resist 302 is pasted on the surface of the wiring substrate 100. The dry film resist is removed from the wiring portions including the opening portions 131 and 132. An opening diameter of the dry film resist 302 in the vicinity of the opening portion 131 is, for example, about 27 to 47 m, and an opening diameter of the dry film resist 302 in the vicinity of the opening portion 132 is, for example, about 60 to 80 µm. In addition, thickness of the dry film resist 302 is, for example, about 30 to 40 µm.

For example, copper plating is performed so that first metal layers 151 and 161 are formed in the opening portions 131 and 132 (step S203). On this occasion, composition of a copper sulfate plating solution used for the copper plating is, for example, as follows.

copper sulfate: 100 to 200 g/L
sulfuric acid: 100 to 200 g/L
chloride ions: 1 to 20 ppm
polymer (inhibitor): 1 to 10 mL/L
brightener (accelerant): 1.0 to 5.0 mL/L
leveler: 0.1 to 3.0 mL/L Incidentally, for example, a non-ion surface active agent such as polyethylene glycol (polyether compound) can be used as the polymer (inhibitor). For example, an organic sulfur-based compound such as bis(3-sulfopropyl)disulfide can be used as the brightener (accelerant). In addition, for example, a quaternary amine compound can be used as the leveler.

Figure 12:
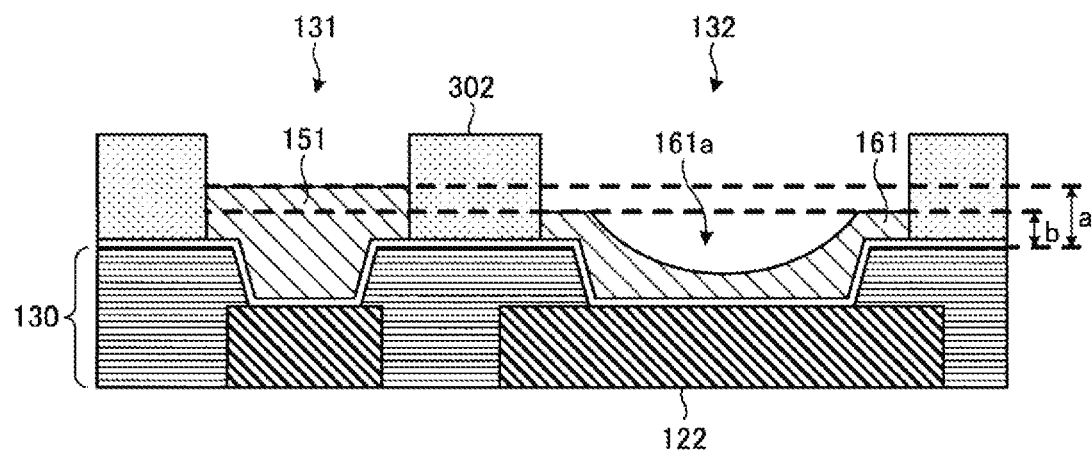
FIG. 12 is a view illustrating formation of a first metal layer.

The copper plating is performed by the copper sulfate plating solution having the aforementioned composition on electrolytic copper plating conditions, for example, including current density set at 0.1 to 1.0 ASD (A/dm$^2$) and a plating time set at 40 to 80 minutes. Thus, for example, as shown in FIG. 12, the first metal layer 151 whose upper face is flat is formed in the small-diameter opening portion 131, and the first metal layer 161 having a recess 161$a$ at the center is formed in the large-diameter opening portion 132. A bottom face of the recess 161$a$ of the first metal layer 161 is curved, and a deepest portion of the recess 161$a$ is positioned to be lower than the upper face of the solder resist layer 130. In other words, the recess 161$a$ has the bottom face which is closer to the wiring layer 122 than the surface of the solder resist layer 130. Therefore, a distance between the bottom face of the recess 161$a$ and the wiring layer 122 is shorter than a distance between the upper face of the solder resist layer 130 and the wiring layer 122. Further, a portion of the recess 161$a$ is positioned inside the opening portion 132.

In addition, thickness a of the first metal layer 151 between the upper face of the solder resist layer 130 and the upper face of the first metal layer 151 is, for example, about 5 to 15 µm whereas thickness b of the first metal layer 161 between the upper face of the solder resist layer 130 and the upper face of the first metal layer 161 is, for example, about 3 to 12 µm. The first metal layer 161 is thinner than the first metal layer 151. The first metal layer 161 having the recess 161*a* is formed thus in the large-diameter opening portion 132 to be thinner than the first metal layer 151 for the following reason.

That is, the polymer which inhibits plating precipitation action is more difficulty adsorbed inside the opening portion 131, 132 than in the vicinity of the opening portion 131, 132. On the other hand, the brightener accelerating the plating precipitation action is uniformly adsorbed in the vicinity of the opening portion 131, 132 and inside the opening portion 131, 132. As a result, a plating precipitation amount inside the opening portion 131, 132 increases in comparison with that in the vicinity of the opening portion 131, 132. For example, the first metal layer 151 is formed in the opening portion 131 to fill the opening portion 131. In addition, a plating precipitation amount inside the opening portion 132 is also larger than that in the vicinity of the opening portion 132 so that the first metal layer 161 is formed in the opening portion 132 to be thicker inside the opening portion 132 than in the vicinity of the opening portion 132.

The diameter of the opening portion 131 is small and the diameter of the opening portion 132 is large. Accordingly, an adsorption amount of the polymer inside the opening portion 132 is larger than that inside the opening portion 131. Therefore, the plating precipitation action on the opening portion 132 is more strongly inhibited than that on the opening portion 131 so that the first metal layer 161 is thinner than the first metal layer 151. Simultaneously, the plating precipitation action on the neighborhood of the center of the opening portion 132 is more strongly inhibited than that on the opening portion 131. Accordingly, the upper face of the first metal layer 151 is flat whereas the recess 161*a* is formed in the center of the first metal layer 161. Incidentally, the upper face of the first metal layer 151 does not have to be always flat and a recess may be also formed in the center of the first metal layer 151. This recess is shallower than the recess 161*a*. This is because the plating precipitation action is more strongly inhibited as the diameter of the opening portion is larger so that the recess formed in the center is deeper.

In addition, the thickness of the first metal layer 161 in the vicinity of the opening portion 132 is thinner than the thickness of the first metal layer 151 in the vicinity of the opening portion 131. Accordingly, height between the surface of the solder resist layer 130 and the upper face of the first metal layer 161 is lower than height between the surface of the solder resist layer 130 and the upper face of the first metal layer 151. This means that the face where the second metal layer 162 is formed is located at a lower position than the face where the second metal layer 152 is formed.

Figure 13:
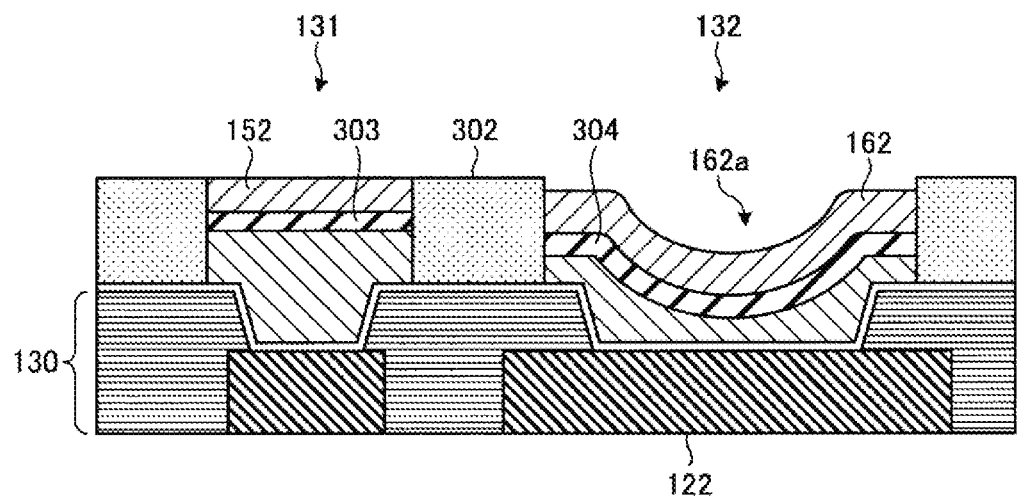
FIG. 13 is a view illustrating formation of a second metal layer.

After the first metal layers 151 and 161 are formed by copper plating, for example, tin plating is performed so that the second metal layers 152 and 162 are formed in the opening portions 131 and 132 (step S204). On this occasion, nickel layers 303 and 304 may be interposed between the first metal layers 151 and 161 and the second metal layers 152 and 162, as shown in FIG. 13. Each of the nickel layers 303 and 304 is formed with uniform thickness along the surface of the first metal layer 151, 161. With the interposition of the nickel layers 303 and 304, the copper of the first metal layers 151 and 161 can be prevented from being eluted or diffused into the tin of the second metal layers 152 and 162. Thickness of each of the nickel layers 303 and 304 is, for example, about 1 to 5 µm. The nickel layer 303, 304 can be, for example, formed by nickel plating to which electrolytic nickel plating conditions including current density set at 1.0 ASD and a plating time set at 17.2 minutes have been applied. Incidentally, a layer of metal other than nickel with a higher melting point than the metal of the second metal layer 152, 162 may be interposed between the first metal layer 151, 161 and the second metal layer 152, 162 in order to prevent the elution or the diffusion of the copper of the first metal layer 151, 161.

Plating of uniform thickness is performed on the opening portion 131, 132 in order to form the second metal layer 152, 162. Therefore, an upper face of the second metal layer 152 is flat in a manner similar to or the same as the upper face of the first metal layer 151. An upper face of the second metal layer 162 has a recess 162*a* in a manner similar to or the same as the upper face of the first metal layer 161. Thickness of each of the second metal layers 152 and 162 is, for example, about 10 to 20 µm. For example, the second metal layer 152, 162 can be formed by tin plating to which electrolytic tin plating conditions including current density set at 1.5 ASD and a plating time set at 23.3 minutes have been applied. The second metal layer 152, 162 may be formed, for example, by use of any of various solder metals such as a tin-silver-based alloy, a tin-silver-copper-based alloy and a tin-bismuth-based in addition to the tin. The thickness of the second metal layer 152, 162 is uniform. Since the diameter of the opening portion 132 is larger than the diameter of the opening portion 131, the volume of the second metal layer 162 is larger than the volume of the second metal layer 152.

Figure 14:
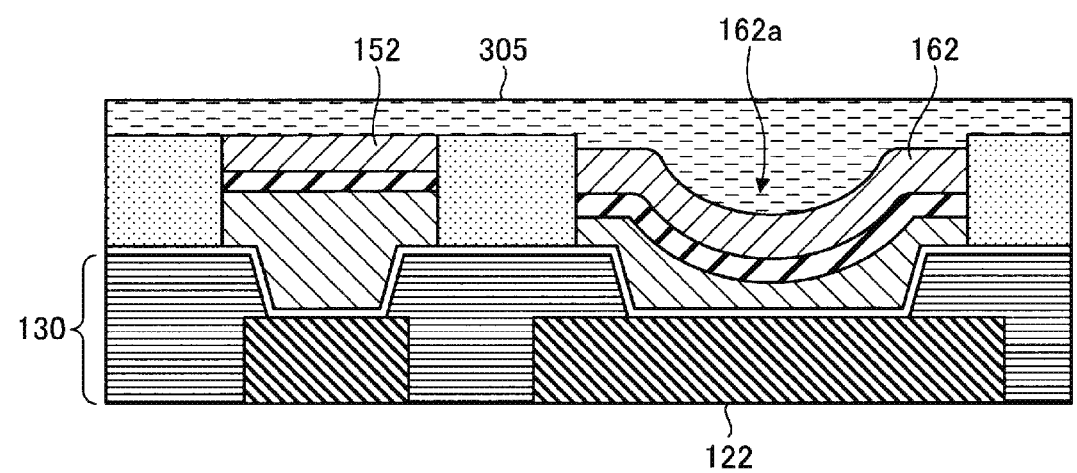
FIG. 14 is a view illustrating a laminate.

After the second metal layers 152 and 162 are formed, the entire surfaces thereof are laminated by a water-soluble resist 305 such as a dry film resist (step S205), for example, as shown in FIG. 14. The water-soluble resist 305 is also filled into the recess 162*a* of the second metal layer 162 to prevent the recess 162*a* from being deformed by the metal (such as the tin) around the recess 162*a* flowing into the recess 162*a*.

Figure 15:
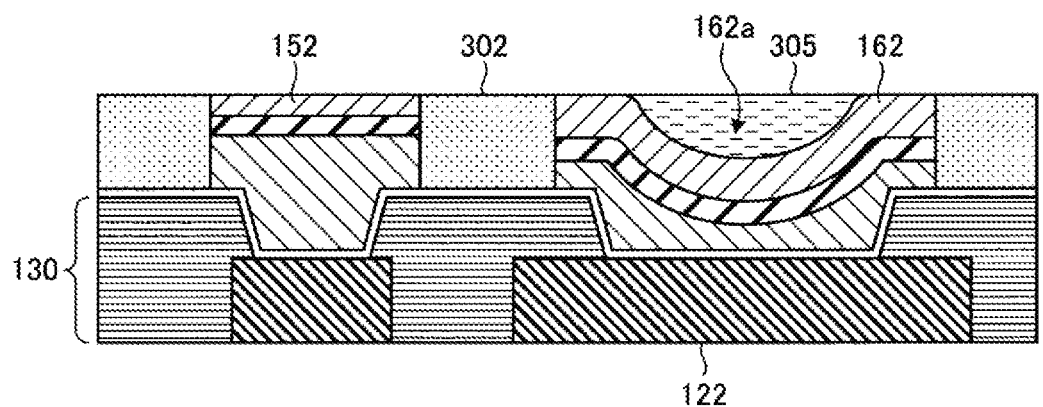
FIG. 15 is a view illustrating grinding.

The water-soluble resist 305 is entirely ground from its upper face (step S206) so that the second metal layer 152 is exposed and the second metal layer 162 is exposed in the vicinity of the recess 162*a*, for example, as shown in FIG. 15. The water-soluble resist 305 is filled into the recess 162*a* so that the shape of the recess 162*a* is maintained. In the grinding step, the second metal layers 152 and 162 are also ground. However, the grinding is completed at a point of time when the left second metal layers 152 and 162 reach proper volumes. The second metal layers 152 and 162, the dry film resist 302, and the water-soluble resist 305 are ground until, for example, the height of the dry film resist 302 is reduced by about 10 to 15 µm.

Figure 16:
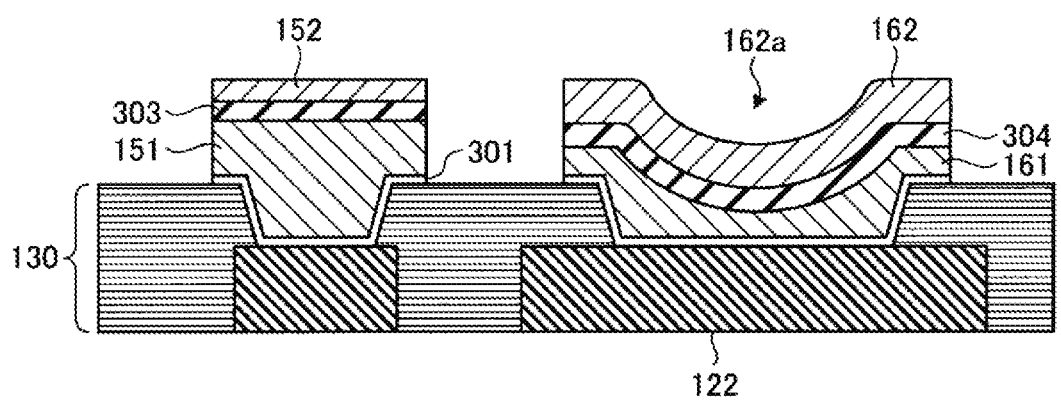
FIG. 16 is a view illustrating stripping of a resist.

The dry film resist 302 and the water-soluble resist 305 are stripped (step S207). For example, caustic soda or an amine-based alkaline stripping solution can be used for the stripping. In addition, flash etching is performed so that portions of the seed layer 301 which were not plated are removed. Thus, for example, as shown in FIG. 16, a conductor portion in which the seed layer 301, the first metal layer 151, the nickel layer 303 and the second metal layer 152 are deposited on one another and which protrudes from the surface of the solder resist layer 130 is formed in the opening portion 131. In addition, a conductor portion in which the seed layer 301, the first metal layer 161, the nickel layer 304 and the second metal layer 162 are deposited on one another and which protrudes from the surface of the solder resist layer 130 is formed in the opening portion 132.

The recess 162*a* remains in the center of the second metal layer 162 in the opening portion 132.

In this state, reflowing based on a reflow temperature high enough to melt the second metal layers 152 and 162 is executed (step S208). That is, after the second metal layers 152 and 162 are melted at high temperature, the second metal layers 152 and 162 are solidified by cooling. On this occasion, the melting point of the metal (such as the copper) forming the first metal layers 151 and 161 is higher than the melting point of the metal (such as the tin) forming the second metal layers 152 and 162. Accordingly, only the second metal layers 152 and 162 are melted and solidified while the first metal layers 151 and 161 are not melted. Furthermore, the melting point of nickel forming the nickel layers 303 and 304 is higher than the melting point of the metal forming the second metal layers 152 and 162. Thus, the nickel layers 303 and 304 are not melted while the second metal layers 152 and 162 are melted.

Figure 17:
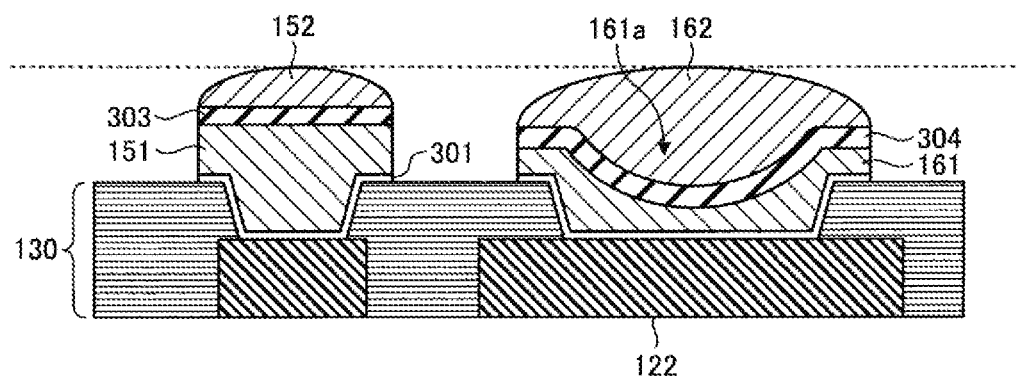
FIG. 17 is a view illustrating reflowing.

Thus, the bumps 150 and 160 are formed with the upper faces of the second metal layers 152 and 162 protruding like spherical shapes, for example, as shown in FIG. 17. Here, a portion of the second metal layer 162 is filled into the recess 161*a* formed in the first metal layer 161, and the upper face of the first metal layer 161 is positioned to be lower than the upper face of the first metal layer 151. Therefore, even when the volume of the second metal layer 162 is larger than the volume of the second metal layer 152, the top portions of the second metal layers 152 and 162 can be the same in height. That is, distances between the upper surface of the solder resist layer 130 and the top portions of the bumps 150 and 160 are equal to each other at a height, for example, ranging from 25 to 35 μm. As a result, when a semiconductor chip 200 is mounted, the bumps 150 and 160 and the electrodes 210 and 220 of the semiconductor chip 200 can be surely contacted with each other to thereby avoid open failure. In addition, there is no fear that only the top portion of one of the bumps 150 and 160 may be pressed excessively by the semiconductor chip 200 to extend in the lateral direction. It is therefore possible to avoid short circuit failure in which adjacent bumps come into contact with each other.

According to the present embodiment as described above, when the bumps having the two-layer structures are formed in the opening portions of the solder resist layer of the wiring substrate by plating, the composition of the plating solution and the electrolytic plating conditions are adjusted to form the recesses each of which is deeper in the center of the first metal layer as the diameter of the opening portion is larger. In addition, in the surface of the solder resist layer in the vicinity of the opening portion, the first metal layer is arranged to be thinner as the diameter of the opening portion is larger. Thus, when the second metal layer overlapping with the first metal layer is melted and solidified, a portion of the second metal layer is filled into the recess of the first metal layer in the large-diameter opening portion, and the second metal layer is formed at the position where the height of the second metal layer from the surface of the solder resist layer is lower. As a result, even when the diameters of the opening portions are different and the volumes of the second metal layer in the opening portions are different accordingly, the heights between the surface of the solder resist layer and the top portions of the bumps formed in the opening portions can be made equal to each other. Thus, connection reliability to an electronic component mounted to be connected to the bumps of the wiring substrate can be improved.

Various aspects of the subject matter described herein are set out non-exhaustively in the following numbered clauses:

1) A method for manufacturing a wiring substrate, the method comprising:
   forming a wiring layer;
   forming an insulating layer to cover the wiring layer;
   forming a first opening portion and a second opening portion in the insulating layer, wherein the first opening portion and the second opening portion expose the wiring layer, and a diameter of the second opening portion is larger than that of the first opening portion;
   forming a first metal layer in the first opening portion and the second opening portion by plating, wherein the first metal layer formed in the second opening portion has a first recess;
   forming a second meal layer on the first metal layer formed in the first opening portion and the second opening portion by plating; and
   melting and solidifying the second metal layer.

2) The method according to Clause (1), wherein
   in forming the second metal layer, the second metal layer opposed to the second opening portion has a second recess, and
   the method further comprises:
   forming a resist layer on the second metal layer so as to fill the second recess;
   grinding the resist layer and the second metal layer such that an upper face of the second metal layer opposed to the first opening portion and an upper face of the second metal layer opposed to the second opening portion are flush with each other; and
   removing the resist layer.

What is claimed is:
1. A wiring substrate comprising:
   a wiring layer;
   an insulating layer covering the wiring layer, and comprising a first opening portion exposing the wiring layer and a second opening portion exposing the wiring layer, wherein a diameter of the second opening portion is larger than that of the first opening portion;
   a first metal layer formed in the first opening portion and the second opening portion, and having a recess in the second opening portion; and
   a second metal layer that is formed on the first metal layer formed in the first opening portion and the second opening portion, wherein a portion of the second metal layer fills the recess,
   wherein
   the first metal layer and the second metal layer serve as connection terminals to be electrically connected to an electronic component, and
   a height of an upper face of the first metal layer formed in the first opening portion is higher than that of an upper face of the first metal layer formed in the second opening portion.

2. The wiring substrate according to claim 1, wherein the second metal layer protrudes like a spherical shape from the first metal layer.

3. The wiring substrate according to claim 1, wherein the height of the upper face of the first metal layer formed in the first opening and the height of the upper face of the first metal layer formed in the second opening are higher than that of an upper face of the insulating layer.

4. The wiring substrate according to claim 1, wherein a distance between a bottom face of the recess and the wiring layer is shorter than a distance between an upper face of the insulating layer and the wiring layer.

5. The wiring substrate according to claim 1, wherein at least a portion of the recess is positioned in the second opening portion.

6. The wiring substrate according to claim 1, wherein a melting point of the first metal layer is higher than that of the second metal layer.

7. The wiring substrate according to claim 1, wherein a height of an upper face of the second metal layer which is opposed to the first opening portion is substantially the same as that of an upper face of the second metal layer which is opposed to the second opening portion.

8. The wiring substrate according to claim 1, wherein
the first metal layer and the second metal layer, which are opposed to the first opening portion, serve as a first connection terminal to be electrically connected to an electronic component,
the first metal layer and the second metal layer, which are opposed to the second opening portion, serve as a second connection terminal to be electrically connected to the electronic component, and
a diameter of the second connection terminal is larger than that of the first connection terminal.

9. A wiring substrate comprising:
a wiring layer;
an insulating layer covering the wiring layer, and comprising a first opening portion exposing the wiring layer and a second opening portion exposing the wiring layer, wherein a diameter of the second opening portion is larger than that of the first opening portion;
a first metal layer formed in the first opening portion and the second opening portion, and having a recess in the second opening portion; and
a second metal layer that is formed on the first metal layer formed in the first opening portion and the second opening portion, wherein a portion of the second metal layer fills the recess,
wherein
the first metal layer and the second metal layer serve as connection terminals to be electrically connected to an electronic component, and
an upper face of the first metal layer formed in the first opening portion is formed as a flat face.

10. The wiring substrate according to claim 9, wherein the second metal layer protrudes like a spherical shape from the first metal layer.

11. The wiring substrate according to claim 9, wherein the height of the upper face of the first metal layer formed in the first opening portion and a height of an upper face of the first metal layer formed in the second opening portion are higher than that of an upper face of the insulating layer.

12. The wiring substrate according to claim 9, wherein a distance between a bottom face of the recess and the wiring layer is shorter than a distance between an upper face of the insulating layer and the wiring layer.

13. The wiring substrate according to claim 9, wherein at least a portion of the recess is positioned in the second opening portion.

14. The wiring substrate according to claim 9, wherein a melting point of the first metal layer is higher than that of the second metal layer.

15. The wiring substrate according to claim 9, wherein a height of an upper face of the second metal layer which is opposed to the first opening portion is substantially the same as that of an upper face of the second metal layer which is opposed to the second opening portion.

16. The wiring substrate according to claim 9, wherein
the first metal layer and the second metal layer, which are opposed to the first opening portion, serve as a first connection terminal to be electrically connected to an electronic component,
the first metal layer and the second metal layer, which are opposed to the second opening portion, serve as a second connection terminal to be electrically connected to the electronic component, and
a diameter of the second connection terminal is larger than that of the first connection terminal.

17. A wiring substrate according to claim 1, further comprising:
a wiring layer;
an insulating layer covering the wiring layer, and comprising a first opening portion exposing the wiring layer and a second opening portion exposing the wiring layer, wherein a diameter of the second opening portion is larger than that of the first opening portion;
a first metal layer formed in the first opening portion and the second opening portion, and having a recess in the second opening portion;
a second metal layer that is formed on the first metal layer formed in the first opening portion and the second opening portion, wherein a portion of the second metal layer fills the recess; and
a third metal layer formed between the first metal layer and the second metal layer,
wherein the first metal layer, the second metal layer, and the third metal layer serve as connection terminals to be electrically connected to an electronic component.

18. The wiring substrate according to claim 17, wherein the second metal layer protrudes like a spherical shape from the first metal layer and the third metal layer.

19. The wiring substrate according to claim 17, wherein a height of an upper face of the first metal layer is higher than that of an upper face of the insulating layer.

20. The wiring substrate according to claim 17, wherein a distance between a bottom face of the recess and the wiring layer is shorter than a distance between an upper face of the insulating layer and the wiring layer.

21. The wiring substrate according to claim 17, wherein at least a portion of the recess is positioned in the second opening portion.

22. The wiring substrate according to claim 17, wherein a melting point of the first metal layer is higher than that of the second metal layer.

23. The wiring substrate according to claim 17, wherein a height of an upper face of the second metal layer which is opposed to the first opening portion is substantially the same as that of an upper face of the second metal layer which is opposed to the second opening portion.

24. The wiring substrate according to claim 17, wherein
the first metal layer, the second metal layer, and the third metal layer, which are opposed to the first opening portion, serve as a first connection terminal to be electrically connected to an electronic component,
the first metal layer, the second metal layer, and the third metal layer, which are opposed to the second opening portion, serve as a second connection terminal to be electrically connected to the electronic component, and
a diameter of the second connection terminal is larger than that of the first connection terminal.

* * * * *

UNITED STATES PATENT AND TRADEMARK OFFICE
CERTIFICATE OF CORRECTION

PATENT NO. : 10,964,633 B2
APPLICATION NO. : 16/852913
DATED : March 30, 2021
INVENTOR(S) : Hikaru Tanaka It is certified that error appears in the above-identified patent and that said Letters Patent is hereby corrected as shown below:

In the Claims

In Claim 17, Column 14, Lines 12-13:
Change "A wiring substrate according to claim 1, further comprising:" to --A wiring substrate, comprising:--

Signed and Sealed this
Fourth Day of April, 2023

Katherine Kelly Vidal
*Director of the United States Patent and Trademark Office*